United States Patent
Lipson et al.

(10) Patent No.: US 6,512,606 B1
(45) Date of Patent: Jan. 28, 2003

(54) OPTICAL STORAGE MEDIA AND METHOD FOR OPTICAL DATA STORAGE VIA LOCAL CHANGES IN REFLECTIVITY OF A FORMAT GRATING

(75) Inventors: Matthew Lipson; Sergei Sochava, both of Sunnyvale; Lambertus Hesselink, Atherton; Brian H. Cumpston, Sunnyvale; Robert R. McLeod, Morgan Hill; Charles D. Claude, San Jose, all of CA (US)

(73) Assignee: Siros Technologies, Inc., San Jose, CA (US)

( * ) Notice: Subject to any disclaimer, the term of this patent is extended or adjusted under 35 U.S.C. 154(b) by 0 days.

(21) Appl. No.: 09/364,324

(22) Filed: Jul. 29, 1999

(51) Int. Cl.⁷ .............................. G03H 1/18; G03H 5/00; G03C 1/00; G11B 7/00; G11C 19/08
(52) U.S. Cl. .............................. 359/3; 359/35; 369/103; 365/125; 430/2
(58) Field of Search .............................. 359/30, 4, 5, 6, 359/7, 35; 365/125; 369/103, 107; 430/1, 2

(56) References Cited

U.S. PATENT DOCUMENTS

| | | | |
|---|---|---|---|
| 3,618,049 A | 11/1971 | Amodei et al. | 340/173 |
| 3,632,869 A | 1/1972 | Bartollini et al. | 178/6.8 |
| 3,635,545 A | 1/1972 | van Kerkhove et al. | 350/163 |

(List continued on next page.)

FOREIGN PATENT DOCUMENTS

| | | | | |
|---|---|---|---|---|
| DE | 42 08 328 A 1 | 9/1993 | | G11B/7/00 |
| DE | 195 34 501 A1 | 5/1996 | | G11B/7/007 |
| JP | 403068949 A | 3/1991 | | |
| JP | 07005796 A | 1/1995 | | |
| JP | 410102766 A | 5/1998 | | C08G/59/68 |
| WO | WO 97/13183 | 4/1997 | | |
| WO | WO 97/44714 | 11/1997 | | |
| WO | WO 99/26112 | 5/1999 | | |
| WO | WO 99/39248 | 8/1999 | | |

OTHER PUBLICATIONS

Fleisher et al., "An Optically Accessed Memory Using the Lippmann Process for Information Storage" *Optical and Electro–Optical Information Processing*, 1965, Chapter 1, MIT Press, pp. 11–40.

Serdyuk et al., "Structure of Wave Fields Formed by 3–D Vector Holograms," *Opt. Spectrosc (USSR)*, vol. 57, No. 4, Oct. 1984, pp. 415–419.

Parthenopoulos et al., "Three–Dimensional Optical Storage Memory," *Science*, Aug. 25, 1989, vol. 245, pp. 843–845.

(List continued on next page.)

*Primary Examiner*—Jon Henry
(74) *Attorney, Agent, or Firm*—Sierra Patent Group, Ltd.

(57) ABSTRACT

An optical data storage system and method comprising a photopolymer medium having generally a polymerizable monomer, an active binder, a first, hologram recording polymerization initiator, and a second, data writing polymerization initiator. The monomer is preferably a cationic ring-opening monomer. The hologram recording polymerization initiator preferably comprises a sensitizer and photoacid generator which initiate a first polymerization in the medium which defines a format hologram. The format hologram recording is carried out via interference of a signal and reference beam, with the sensitizer being specific for the wavelength(s) of the signal and reference beams. The hologram recording polymerization is only partial and does not consume all of the monomer present in the photopolymer medium. A second stage, a data writing polymerization initiator, specific to a data writing beam, locally advances polymerization at selected data storage locations to alter the previously recorded format hologram, resulting in optical data storage as localized alterations in the format hologram.

12 Claims, 13 Drawing Sheets

U.S. PATENT DOCUMENTS

| | | | |
|---|---|---|---|
| 3,704,929 A | 12/1972 | Sakaguchi et al. | 350/3.5 |
| 3,720,921 A | 3/1973 | Schools et al. | 340/13 |
| 3,860,950 A | 1/1975 | Wick et al. | 358/2 |
| 3,903,360 A | 9/1975 | Kamisaka et al. | 178/6.7 A |
| 3,936,140 A * | 2/1976 | Ruell | 359/1 |
| 3,947,640 A | 3/1976 | Ruell et al. | 179/100.3 B |
| 4,024,513 A | 5/1977 | Huignard et al. | 340/173 |
| 4,026,705 A | 5/1977 | Crivello et al. | 96/27 R |
| 4,034,355 A * | 7/1977 | Carlsen | 365/235 |
| 4,045,115 A | 8/1977 | Lee | 350/3.5 |
| 4,058,401 A | 11/1977 | Crivello | 96/115 R |
| 4,138,189 A | 2/1979 | Huignard et al. | 350/3.64 |
| 4,183,094 A | 1/1980 | Keezer et al. | 365/127 |
| 4,187,111 A * | 2/1980 | Chandross et al. | 430/2 |
| 4,250,053 A | 2/1981 | Smith | 252/426 |
| 4,318,581 A | 3/1982 | Guest et al. | 350/3.74 |
| 4,458,345 A | 7/1984 | Bjorklund et al. | 369/103 |
| 4,467,462 A | 8/1984 | Shibata | 369/45 |
| 4,775,968 A | 10/1988 | Ohsato | 369/46 |
| 4,859,548 A | 8/1989 | Heise et al. | 430/1 |
| 4,920,220 A | 4/1990 | Phaff | 544/90 |
| 4,924,455 A | 5/1990 | Fujiie et al. | 369/44.21 |
| 4,999,234 A | 3/1991 | Cowan | 428/156 |
| 5,157,555 A | 10/1992 | Reno | 359/823 |
| 5,161,039 A | 11/1992 | Schellenberg | 359/3 |
| 5,191,574 A | 3/1993 | Henshaw et al. | 369/100 |
| 5,202,875 A | 4/1993 | Rosen et al. | 369/94 |
| 5,242,715 A | 9/1993 | Schoen et al. | 427/396 |
| 5,243,589 A | 9/1993 | Stuke et al. | 369/100 |
| 5,263,011 A | 11/1993 | Maeda et al. | 369/44.27 |
| 5,283,777 A | 2/1994 | Tanno et al. | 369/108 |
| 5,289,407 A | 2/1994 | Strickler et al. | 365/106 |
| 5,331,445 A | 7/1994 | Dickson et al. | 359/15 |
| 5,361,238 A | 11/1994 | Owechko | 365/234 |
| 5,408,453 A | 4/1995 | Holtslag et al. | 369/44.23 |
| 5,415,835 A | 5/1995 | Brueck et al. | 430/311 |
| 5,422,873 A | 6/1995 | Kewitsch et al. | 369/103 |
| 5,430,701 A | 7/1995 | Ito et al. | 369/44.41 |
| 5,440,669 A | 8/1995 | Rakuljic et al. | 359/7 |
| 5,450,218 A | 9/1995 | Heanue et al. | 359/21 |
| 5,453,340 A | 9/1995 | Kawabata et al. | 430/2 |
| 5,477,347 A | 12/1995 | Redfield | 369/3 |
| 5,479,394 A | 12/1995 | Yashima et al. | 369/275.1 |
| 5,499,231 A | 3/1996 | Fennema et al. | 369/124 |
| 5,513,158 A | 4/1996 | Ohsato | 369/44.23 |
| 5,526,336 A | 6/1996 | Park et al. | 369/94 |
| 5,529,861 A | 6/1996 | Redfield | 430/1 |
| 5,547,748 A * | 8/1996 | Ruoff | 428/323 |
| 5,559,773 A | 9/1996 | Kentatsu et al. | 369/44.42 |
| 5,566,387 A | 10/1996 | Dewald | 369/103 |
| 5,590,110 A | 12/1996 | Sato | 369/100 |
| 5,610,895 A | 3/1997 | Izumi et al. | 369/112 |
| 5,627,814 A | 5/1997 | Lee | 369/116 |
| 5,636,190 A | 6/1997 | Choi | 369/44.23 |
| 5,639,579 A | 6/1997 | Hayashi et al. | 430/7 |
| 5,659,536 A | 8/1997 | Maillot et al. | 369/275.1 |
| 5,671,207 A | 9/1997 | Park | 369/112 |
| 5,682,372 A | 10/1997 | Yamakawa et al. | 369/94 |
| 5,691,971 A | 11/1997 | Kim | 369/112 |
| 5,696,743 A | 12/1997 | Kawasaki et al. | 369/32 |
| 5,698,345 A | 12/1997 | Ohe et al. | 430/2 |
| 5,701,288 A | 12/1997 | Seong | 369/112 |
| 5,702,846 A * | 12/1997 | Sato et al. | 430/2 |
| 5,712,730 A | 1/1998 | Zarschitzky et al. | 359/569 |
| 5,729,522 A | 3/1998 | Akama et al. | 369/112 |
| 5,737,294 A | 4/1998 | Yamakawa et al. | 369/99 |
| 5,737,295 A | 4/1998 | Lee | 369/103 |
| 5,740,136 A | 4/1998 | Tsutsui et al. | 369/44.25 |
| 5,748,597 A | 5/1998 | Kim | 369/94 |
| 5,754,512 A | 5/1998 | Komma et al. | 369/112 |
| 5,757,744 A | 5/1998 | Akkermans | 369/44.25 |
| 5,759,721 A | 6/1998 | Dhal et al. | 430/1 |
| 5,761,111 A | 6/1998 | Glezer | 365/106 |
| 5,764,606 A | 6/1998 | Fukumoto et al. | 369/44.41 |
| 5,768,242 A | 6/1998 | Juday | 369/103 |
| 5,776,634 A | 7/1998 | Ohkuma et al. | 430/2 |
| 5,786,117 A | 7/1998 | Hoshi et al. | 430/21 |
| 5,790,493 A | 8/1998 | Takeya et al. | 369/58 |
| 5,793,720 A | 8/1998 | Nishikata | 369/44.25 |
| 5,793,721 A | 8/1998 | Akkermans | 369/44.27 |
| 5,811,789 A | 9/1998 | Nix | 250/201.2 |
| 5,822,090 A | 10/1998 | Wilde | 359/7 |
| 5,891,656 A | 4/1999 | Zarling et al. | 435/792 |
| 5,966,361 A | 10/1999 | Stoll | 369/103 |
| 5,982,513 A | 11/1999 | Zhou et al. | 359/22 |
| 6,020,985 A | 2/2000 | McLeod et al. | 369/22 |
| 6,045,888 A | 4/2000 | Chen et al. | 428/64.1 |
| 6,111,828 A | 8/2000 | McLeod et al. | 369/44.23 |

OTHER PUBLICATIONS

Kawata et al., "Photopolymer System and its Application to a Color Hologram" *Applied Optics*, vol. 33, No. 11, pp. 2152–2156, Reprinted: *Optical Society of America*, 1994, pp. 147–151.

Perry et al., "Enhanced Reverse Saturable Absorption and Optical Limiting in Heavy–Atom Substitued Phthalocyanines," a reprint from *Optics Letters, Jet Propulsion Laboratory, California Institute of Technology*, May 1, 1994, vol. 19, No. 9, pp. 625–627.

Homan et al., "High–Capacity Optical Storage Using Multiple Wavelengths, Multiple Layers and Volume Holograms," *Electronics Letters*, Apr. 13, 1995, bol. 31, No. 8, pp. 621–623.

Kawata et al., "Three–Dimensional Optical Memory with a Photorefractive Crystal," *Applied Optics*, Jul. 10, 1995, vol. 34, No. 20, pp. 4105–4110.

Kardinahl et al., "Photoinduced Refractive–Index Changes in Fulgide–Doped PMMA Films," *Applied Physics A: Materials Science and Processing*, 1995, vol. 61, No. 1, pp. 23–27.

Lessard et al., "Selected Papers on Photopolymers," *SPIE*, 1995, vol. MS 114.

Waldman et al., "Cationic Ring–Opening Photopolymerization Methods for Volume Hologram Recording," *SPIE*, 1996, vol. 2689, No. 26, pp. 127–141.

Kawata et al., "Randomly Accessible, Multilayered Optical Memory with as Bi 12 SiO 20 Crystal," *Applied Optics*, Sep. 10, 1996, vol. 35, No. 26, pp. 5308–5311.

Perry et al., "Organic Optical Limited with a Strong Nonlinear Absorptive Response," Science, Sep. 13, 1996, vol. 273, pp. 1533–1536, a reprint series from: *1996 by the American Association for the Advancement of Science*.

Glezer et al., "Three–Dimensional Optical Storage Inside Transparent Materials," *Optics Letters*, Dec. 15, 1996, vol. 21, No. 24, pp. 2023–2025.

Waldman et al., "Determination of Low Transverse Shrinkage in Slant Fringe Gratings of a Cationic Ring–Opening Volume Hologram Recording Material," *SPIE*, 1997, vol. 3010, pp. 354–372.

Nalwa et al., "Nonlinear Optics of Organic Molecules and Polymers," *CRC Press, Inc.*, 1997, pp. 813–840.

Eichler et al., "High Density Disc Storage by Multiplexed Microholograms," *SPIE –The International Society for Optical Engineering*, Apr. 7–9, 1997, vol. 3109, pp. 239–244.

Diez et al., "High Density Disc Storage by Multiplexed Microholograms," *Cleo 97*, 1997, pp. 258–259.

Eichler et al., "High Density Disc Storage by Multiplexed Microholograms," *SPIE –The International Society for Optical Engineering*, Apr. 7–9, 1997, vol. 3109, pp. 239–244.

Waldman et al., "Holographic Recording Properties in Thick Films of ULSH–500 Photopolymer," *SPIE*, 1998, vol. 3291, pp. 89–103.

Eichler et al., "Multiplexed Holograms for the Microholographic Storage Disc," *Technical Digest*, May 10–13, 1998, vol. 8, pp. 77–79.

Khairutdinov et al., "Photochromism of Spirooxazines in Homogeneous Solution and Phospholipid Liposomes," *Journal of the American Chemical Society*, Dec. 16, 1998, vol. 120, No. 49, pp. 12707–12713.

Eichler et al., "Holographic Recording of Microscopic Bragg–Reflectors for Optical Storage, " *SPIE*, 1998, vol. 3401, pp. 118–127.

Cumpston et al., "Two–Photon Polymerization Initiators for Three–Dimensional Optical Data Storage and Microfabrication," *Nature*, Mar. 1999, pp. 51–54.

Loy et al., "Cyclization Phenomena in the Sol–Gel Polymerization of a, w–Bis (triethoxysily) Alkanes and Incorporation of the Cyclic Structures into Network Silsesquioxane Polymers," *Journal of the American Chemistry Society*, 1999, vol. 121, pp. 5413–5425.

H.J. Eichler, "Wavelength Multiplexing for the Microholographic Storage Disc," *SPIE*, 1998, vol. 3401, pp. 177–186.

Albota et al., "Design of Organic Molecules with Large Two–Photon Absorption Cross Sections," *Science*, Sep. 11, 1998, vol. 281, pp. 1653–1656.

J. Eickmans et al., "Photoaddressable Polymers: A New Class of Materials for Optical Data Storage and Holographic Memories," 1999, pp. 184–185.

* cited by examiner

MONOMER

SURFACE
FUNCTIONALIZATION
AGENT

OPTICAL STORAGE MEDIA AND METHOD FOR OPTICAL DATA STORAGE VIA LOCAL CHANGES IN REFLECTIVITY OF A FORMAT GRATING

RELATED APPLICATION DATA

This application is related to the U.S. patent application Ser. No. 09/016,382 filed Jan. 30, 1998, now U.S. Pat. No. 6,212,148 and entitled "Optical Data Storage by Selective Localized Alteration of a Format Hologram," by inventors Lambertus Hesselink, Robert R. McLeod, Sergei L. Sochava, and William Phillips, which is assigned to the assignee of the present invention, and incorporated herein by reference as if set forth fully herein.

BACKGROUND OF THE INVENTION

1. Field of the Invention

The present invention relates to the storage of digital data using an optical medium. More specifically, the present invention relates to a method and material for utilizing dispersed nanoparticles, linear electron transfer or nonlinear two-photon absorption to initiate second stage polymerization in volumetric optical data storage and, thus, store data by changing local reflectivity of a format hologram.

2. Background

Optical data storage technology has tended to follow two complementary lines of development. In one approach, data is encoded as minute variations in the surface of a recording medium, such as a compact disc, or CD. The data are readable using optical means (usually a laser), similar to the way in which data recorded in a magnetic medium are readable with a magnetically-sensitive head, or data recorded in a vinyl medium are readable with a needle. Unlike vinyl recording, however, in optical storage the data are usually stored digitally. For read-only compact discs, data are stored as microscopic pits on the surface of a substrate. In addition, recordable or re-writable bit-based optical systems are readily available. Examples include magneto-optic systems, in which the orientation of a magnetic domain changes the direction of rotation of the polarization of a reflected, focussed light beam; phase-change systems, in which a medium can be locally crystalline or polycrystalline, each of which states have a variance in reflectivity; and, dye-polymer systems, in which the reflectivity of a medium is changed by the high-power illumination.

Each bit of data has a specific physical location in the storage medium. The storage density of optical media is limited by physical constraints on the minimum size of a recording spot. Another basic limitation of conventional optical storage is that data are usually stored on the surface of the medium only. Recording throughout the volume of a storage medium would provide an opportunity to increase capacity.

Multi-layer storage is also possible, but usually requires the manufacture of special, heterogeneous, layered recording media, whose complexity increases quickly with the number of layers needed. Most commercially-available multi-layer optical storage media offer no more than two data layers, and come in a pre-recorded format.

An alternative approach to traditional optical storage is based on holographic techniques. In conventional volume holographic recording, laser light from two beams, a reference beam and a signal beam containing encoded data, meet within the volume of a photosensitive holographic medium. The interference pattern from the superposition of the two beams results in a change or modulation of the refractive index of the holographic medium. This modulation within the medium serves to record both the intensity and phase information from the signal. The recorded intensity and phase data are then retrieved by exposing the storage medium exclusively to the reference beam. The reference beam interacts with the stored holographic data and generates a reconstructed signal beam which is proportional to the initial signal beam used to store the holographic image. For information on conventional volume holographic storage, see, for example, U.S. Pat. Nos. 4,920,220, 5,450,218, and 5,440,669.

Typically, volume holographic storage is accomplished by having data written on the holographic medium in parallel, on 2-dimensional arrays or "pages" containing $1 \times 10^6$ or more bits. Each bit is generally stored as information extending over a large volume of the holographic storage medium, therefore, it is of no consequence to speak in terms of the spatial "location" of a single bit. Multiple pages can then be stored within the volume by angular, wavelength, phase-code or related multiplexing techniques.

Unfortunately, conventional volume holographic storage techniques generally require complex, specialized components such as amplitude and/or phase spatial light modulators. Ensuring that the reference and signal beams are mutually coherent over the entire volume of the recording medium generally requires a light source with a relatively high coherence length, as well as a relatively stable mechanical system. These requirements have, in part, hindered the development of inexpensive, stable, and robust holographic recording devices and media capable of convenient operation in a typical user environment.

In order for volumetric optical data storage to mature into a viable data storage option the process must be developed so that the operation is relatively simple, inexpensive and robust. Foremost in this development is accomplishing multi-depth bit-wise optical data storage and/or retrieval. As data recording proceeds to a greater number of depths within the storage medium it becomes increasingly more critical to isolate the recorded bit within a specific area within the medium. In multi-depth storage and/or retrieval, it is also important to write data at a given depth without affecting data at other depths. Further, for multi-depth bit-wise optical data storage and/or retrieval, it is important to have separate write and read conditions, so that readout does not negatively affect recorded data.

BRIEF DESCRIPTION OF THE INVENTION

Briefly, and in general terms, the present invention comprises an improved optical data storage medium including a photopolymer for recording a hologram in a first stage polymerization under a first condition, and for recording data as localized alterations in the hologram at discrete, selected data storage locations within the storage medium in a second stage polymerization under a second condition. The photopolymer may comprise a first, hologram recording polymerization initiator, and a second, data recording polymerization initiator. In one preferred embodiment the hologram recording polymerization initiator generally comprises a linear absorbing sensitizer dye specific to a hologram writing wavelength or wavelengths, together with the first polymerization initiator, which may comprise a photoacid generator. In a first embodiment, the data writing polymerization initiator comprises nanoparticles dispersed throughout the photopolymer matrix. Light absorbed by the nanoparticles is converted to heat which initiates the chemistry required to write data as localized alterations to the format hologram. In a second embodiment the invention, the second stage polymerization initiator comprises a linear absorbing sensitizer dye, specific to a wavelength of the data writing or storage beam, which is homogeneously dissolved or dispersed throughout the photopolymer. In yet another embodiment, the data writing polymerization initiator exhibits a two-photon absorption mechanism, specific to a wavelength of the data writing or storage beam, which is homogeneously dissolved or dispersed throughout the photopolymer.

The invention further comprises a method for recording a format hologram and for recording data in an optical data storage medium. The method comprises the recording a format hologram in a photopolymer medium, by polymerizing monomer using a first, hologram recording polymerization initiator, and writing data by polymerizing monomer using a second, data writing polymerization initiator. The hologram recording polymerization initiator and data writing polymerization initiator are part of the photopolymer medium. The step of recording data may comprise one of three alternative polymerization initiating embodiments. In the embodiments described herein, given by way of example and not necessarily of limitation, each of the data recording methods rely on local polymerization changing the amplitude of the refractive index modulation of the format grating in the desired storage location.

A first method of data recording involves dispersed nanoparticles absorbing light of a given intensity, transferring the heat from the absorbing nanoparticles to a thermal-acid generator, initiating the generation of acid and using the thermally generated acid to further polymerize the media. The further polymerization results in recording data by locally altering the previously written format hologram grating.

A second method of data recording involves use of a photosensitizer absorbing light of a given intensity and wavelength, transferring an electron from the photosensitizer to a photo-acid generator, initiating the generation of acid and using the photo-generated acid to further polymerize the media, thereby recording data by locally altering the format hologram grating.

A third method of data recording involves a "two-photon absorbing" photo-acid generator absorbing light of an increased intensity so as to cause direct excited state two-photon absorption in the photo-acid generator, initiating the generation of acid and using the acid to further polymerize the media thereby recording data by locally altering the format hologram grating Additionally, the invention also comprises a method for producing high optical quality carbon black dispersions in a polymer matrix using surface functionalization. This method comprises the steps of adding an appropriate mass of carbon black to an acceptable monomer, adding an appropriate mass of a trimethoxy silane derivative to the carbon black-monomer combination, mechanically milling the formulation to lessen aggregation, and filtering the formula to remove aggregated particles.

Preferably, the invention also comprises an optical data storage device comprising the optical data storage medium discussed above and having a format hologram stored within the medium. This optical data storage device may take the form of a disk, a tape, a card or the like.

DETAILED DESCRIPTION OF THE INVENTION

Figure 1:
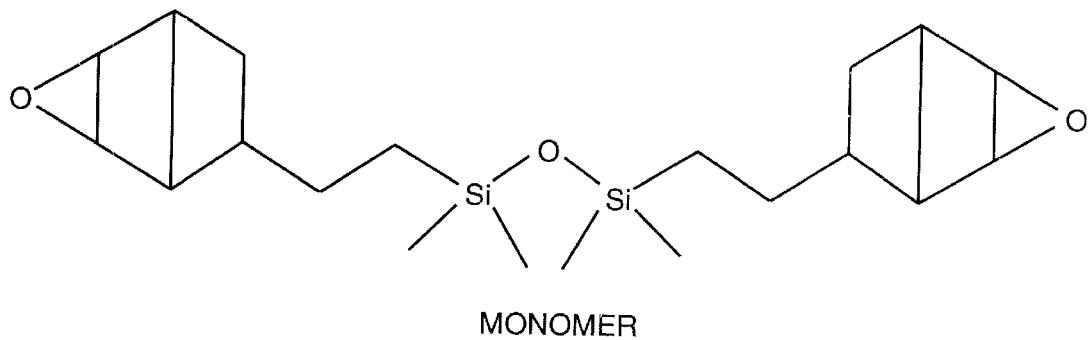
FIG. 1 is a molecular structure of a monomer used in the production of high optical quality carbon black dispersions in accordance with a presently preferred embodiment of the present invention.

In a presently preferred embodiment of the invention, given by way of example and not necessarily of limitation, an optical data storage medium of the invention comprises a photopolymer medium having generally a polymerizable monomer, an active binder, a first, hologram recording polymerization initiator, and a second, data writing polymerization initiator. The monomer is preferably a cationic ring-opening monomer. The hologram recording polymerization initiator preferably comprises a sensitizer and photoacid generator which initiate a first polymerization in the medium which defines a format hologram. The format hologram recording is carried out via interference of a signal and reference beam in a conventional manner, with the sensitizer being specific for the wavelength(s) of the signal and reference beams. The hologram recording polymerization only partially consumes the monomer present in the photopolymer medium. The unreacted monomer remaining after hologram recording is used in the subsequent data writing polymerization, wherein polymerization is locally initiated at selected data storage locations to alter the previously recorded hologram.

In a preferred embodiment the data writing polymerization initiator comprises nanoparticles which absorb light and thermally initiate a second polymerization at selected data storage locations to provide data storage. Preferably, the nanoparticles include a thermal acid generator (TAG) adsorbed to, bonded to, or otherwise associated with the particles, and heat generated via light absorption by the nanoparticles is transferred to the thermal acid generator, which thermally generates an acid that initiates the data writing polymerization. The data writing is non-holographic, and is carried out using a single data writing or storage beam which is directed towards selected data storage locations within the optical medium. The data writing occurs as polymerization which alters microlocalized portions of the format hologram at the selected data storage locations. In presently preferred embodiments the alteration is in the form of a deletion of microlocalized portions of the format hologram. The hologram recording and data storage polymerizations of the invention may be carried out at different wavelengths, and thus the hologram recording polymerization initiator may be specifically sensitive to a first, hologram storage wavelength, while the data writing polymerization initiator is specifically sensitive to a second, data writing wavelength.

The nanoparticles are dispersed homogeneously in the photopolymer medium for the purpose of initiating the chemistry that allows for bit-wise data recording at selected data storage locations at multiple depths within the storage medium. The use of such nanoparticles, typically an insoluble material such as a pigment, on the order of 10 nanometers in diameter or less, in volumetric data storage allows for the heat induced by the absorption of light in the media during photo-thermal initiation to be concentrated at the nanoparticle, thereby achieving high temperature at the particle surface without significantly heating the bulk medium. This characteristic of the nanoparticles improves storage density within the optical data storage medium. Each nanoparticle is highly absorbing and can be heated to elevated temperature, yet the collection of dispersed particles within the media, because of their small size, does not lead to substantial light scattering or strong bulk absorption. Thus, the use of nanoparticles in three-dimensional holographic data storage enables all depth locations within the storage medium to have near equal access to light, meaning no single depth location will tend to absorb more than a small fraction of the incident light.

Generally, a variety of photopolymers may be used with the invention, and numerous examples of suitable photopolymers are described in detail by R. A. Lessard and G. Manivannan (Ed.) in "Selected Papers on Photopolymers", SPIE Milestone Series, Vol. MS 114, SPIE Engineering Press, Bellingham, Wash. (1995), and in the references noted below. With the exception of the second stage or data writing polymerization initiator, the preferred photopolymer media used with the invention are similar to those disclosed in U.S. Pat. No. 5,759,721, issued Jun. 2, 1998 entitled "Holographic Medium and Process for Use Thereof" by inventors Dhal et.al., "Holographic Recording Properties in Thick Films of ULSH-500 Photopolymer", D. A. Waldman et al., SPIE Vol. 3291, pp.89–103 (1998), in "Determination of Low Transverse Shrinkage in Slant Fringe Grating of a Cationic Ring-Opening Volume Hologram recording Material," Waldman et al., SPIE Vol. 3010, pp. 354–372 (1997), "Cationic Ring-Opening Photopolymerization Methods for Volume Hologram Recording, D. A. Waldman et al., pp. 127–141 (1996), "Holographic Medium and Process," by Dhal et al., WO 97/44714 (1997), "Holographic Medium and Process," by Dhal et al., WO 97/13183 (1997), and "Holographic Medium and Process," by Dhal et al., WO 99/26112 (1999). Photopolymers of this type include generally one or more cationic ring opening monomers, a sensitizer, a photoacid generator (PAG), and an active binder. The formulation of photopolymer media, together with the data writing polymerization initiator, is described in detail below. Those of ordinary skill in the art will readily appreciate that other host materials may used in lieu of photopolymers, including glass and crystalline media.

The photopolymer media of the invention provides a monomer/polymer having a relatively low refractive index and an active binder of relatively high refractive index. Photoinduced polymerization during the first, hologram recording polymerization of the monomer induces phase separation of the monomer/polymer and active binder to form low and high refractive index regions to record the hologram. Photoinduced polymerization during the second, data writing polymerization is carried out at selected, localized data storage locations, and results in further phase separation of-the monomer/polymer and active binder at the selected data storage locations, which in turn results in alteration of a pre-written format hologram. The term "active binder" is used herein to describe a material which plays an active role in the formation of a holographic grating as well as the data writing by alteration of the holographic grating. That is, the holographic recording process and data writing process impart a segregation of active binder from monomer and/or polymer. The active binder is appropriately chosen such that it provides a periodic refractive index modulation in the format hologram recorded in the photopolymer. An active binder, in this sense, can be differentiated from the typical use of inert binder materials in photopolymers to impart mechanical properties or processability. The active binder may additionally serve other purposes, such as those of a conventional inert binder.

First stage polymerization of the photopolymer medium for hologram recording is initiated when light of a specified, hologram recording wavelength is absorbed by the sensitizer. Upon absorption of a photon of light, the sensitizer transfers an electron to the PAG. The electron transfer initiates acid generation via the PAG. This acid generation provides for the mechanism whereby first stage polymerization occurs resulting in the formation of the format hologram. Holograms written in cationic ring-opening monomer systems generally have periodic refractive index perturbations resulting from polymerization-induced phase separation, as noted above. The photo-induced polymerization takes place at the bright fringes and active binder migrates away from polymerized material to the dark fringes. In simplified terms, the monomer material moves in to the bright region of the medium while the binder material moves away from the bright region of the medium. As is known by those of ordinary skill in the art, the active binder material may be chosen such that it exhibits a different index of refraction than either the monomer or polymer. The difference in index of refraction between binder and polymer creates the index perturbation that constitutes the resulting hologram. Preferably, the sensitizer is exhausted during the first stage polymerization process that results in the recording of the format hologram. Thus, after the first stage polymerization process, the medium comprises a format hologram and is essentially free of the first stage polymerization initiator. Following the first stage polymerization, photo-thermally induced second stage polymerization is carried out to provide data or bit writing, as related further below.

Prior to the first, hologram recording polymerization, there may initially be a precure stage wherein an initial polymerization is carried out, prior to the format grating recording and data writing polymerizations. The initial polymerization is a precure which reduces unwanted shrinkage during subsequent polymerizations, and which does not result in any periodic phase separation of monomer/polymer and active binder.

In preparing a photopolymer, in accordance with a preferred embodiment of the present invention, the proportions of photo-acid generator, active binder and cationic ring opening monomer may vary over a wide range and the optimum proportions for specific mediums and methods of use can readily be determined by those of ordinary skill in the art. Photopolymers of this nature are disclosed in detail in the references cited above. For example, photopolymers of the described composition can comprise about 3 to about 10 percent by weight of the photo-acid generator, about 20 to about 60 percent by weight of the active binder and from about 40 to about 80 percent by weight cationic ring-opening monomer(s). Other suitable compositions can be readily determined empirically by those of ordinary skill in the art. Additionally, a sensitizer may be added to the photopolymer material to allow format holograms to be recorded at a desired wavelength. Those of ordinary skill in the art will realize that the sensitizer chosen for a specific application will be suitable for the corresponding photopolymer. The sensitizer chosen will generally exhibit absorption at the desired wavelength and, upon excitation, the sensitizer will be capable of transferring an electron to the photo acid generator.

In presently preferred embodiments, photoacid generators used in these photopolymer compositions include 4 octylphenyl(phenyl)iodonium hexafluoroantimonate, bis (methylphenyl)iodonium tetrakis pentafluorophenyl)borate, cumyltolyliodonium tetrakis pentafluorophenyl)borate, or cyclopentadienyl cumene iron(II) hexafluorophosphate. The sensitizer for the photoacid generators is preferably 5,12 bis(phenyl-ethynyl)naphthacene. The monomer is usually a difunctional monomer such as 1,3-bis[2-(3{7 oxabicyclo [4.1.0]heptyl})ethyl]tetramethyl disiloxane, which is available from Polyset Corp. under the name PC-1000™, and/or a tetrafunctional monomer such as tetrakis[2 (3{7-oxabicyclo[4.1.0]heptyl})ethyl(dimethylsilyloxy)silane, which is available from Polyset Corp under the name PC-1004™. The active binder is typically Dow Corning 710™ poly(methylphenylsiloxane) fluid, Dow Corning 705™ 1,3,5-trimethyl-1,1,3,5,5 pentaphenyltrisiloxane, and/or a like silicone oil. The above combined ingredients are generally referred to as "photopolymer". The photopolymer will additionally include a second stage, data writing polymerization initiator as described below.

In a presently preferred embodiment of the invention, the data writing polymerization initiator comprises light-absorbing nanoparticles, together with a thermal-acid generator (TAG) bonded to, adsorbed to, or otherwise associated with the nanoparticle surface. The nanoparticles and associated TAG provide means for initiating the second stage polymerization for data writing.

The nanoparticles of the present invention are typically formed from dye or highly pigmented materials. In a presently preferred embodiment of the present invention the nanoparticles are from carbon black particles. For example, carbon black such as, Monarch 700 manufactured by the Cabot Corporation of Boston, Mass. or Raven 5000 manufactured by the Columbian Chemical Company of Marietta, Ga. may be used in the present invention. By way of example, suitable nanoparticles will characteristically be (1) less than or about 20 nanometers in diameter, (2) have a linear absorption coefficient on the order of $1 \times 10^5$/cm, (3) have a non-emissive excited state of less than or about 1 nanosecond, (4) have a chemically functionalizable or physi-sorbent surface, and (5) be capable of dispersion throughout a bulk media. The nanoparticles of the present invention will typically be capable of being heated rapidly (less than 10 nanoseconds) and intensely ($\Delta T$ greater than 1000K) by the absorption of light and the subsequent rapid conversion of the light energy into heat. This rapid and intense heating initiates chemistry of the molecules in close proximity to the nanoparticle's surface, thereby initiating chemistry in the bulk media.

Essential to the use of nanoparticles in three-dimensional optical data storage is the ability to ensure that the particle dispersions are of low agglomeration, high stability, high optical density and high optical quality. Particle agglomeration is undesirable and may result in increased light scattering and increased shot noise in the writing of data.

In accordance with the present invention, a method for producing high optical quality carbon black dispersions in a photopolymer via surface functionalization is set forth herein. The following is a specific example of preparation of TAG-treated carbon black nanoparticles. As an initial step, oxidized carbon black particles are added to a monomer. The carbon black particles used in this embodiment of the invention may be used as received from the above-identified sources. A suitable monomer for use in this embodiment is the difunctional 1,3-bis[2-(3{7-oxabicyclo [4.1.0 ]heptyl}) ethyl]-tetramethyl disiloxane, manufactured under the name PC-1000™ sold by the Polyset Plastics Company of Mechanicsville, N.Y., as noted above. The molecular structural of this monomer is shown in FIG. 1. The PC-1000™ monomer from Polyset Corp. is dried prior to use by passage through activated silica (high purity grade, 70–230 mesh) which has been heated for two days at 155 degrees C. under dry atmosphere.

Figure 2:
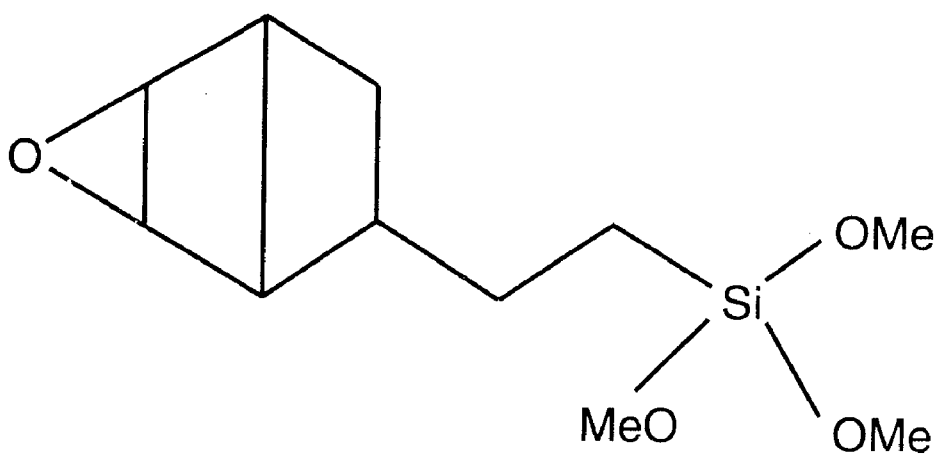
FIG. 2 is a molecular structure of a trimethoxy silane derivative used in the production of high optical quality carbon black dispersions in accordance with a presently preferred embodiment of the present invention.

The desired loading of the carbon black into the monomer will typically be 0.1–0.2% carbon black by mass, and thus 0.1–0.2% w/w is added to PC-1000™ that has been processed as described above. To this mixture a trimethoxy silane derivative is added that serves as a surface functionalization agent. The trimethoxy silane derivative adsorbs and/or bonds covalently to the carbon black particles and stabilizes particle dispersion. The trimethoxy silane derivative used in this example is trimethoxy(2-(7-oxabicyclo (4.1.0) hept-3-yl)ethyl)silane, which is shown in the molecular structural drawing of FIG. 2, and which is available from the Sigma-Aldrich Corporation of St. Louis, Mo. The trimethoxy silane derivative is used as received and is added to the carbon black-monomer mix at an amount of about five times the mass of the carbon black present in the mix. The resulting formulation is milled as a means of breaking apart any carbon black aggregates. In this example, the milling step is carried out using sonication (approximately 20 k Hz, 95–55 Watts for 20 hours), for 24 hours by ball milling employing a SPEX 8000 mixer mill, or by homogenization. The sonication, ball milling and homogenization processes are well known methods in the art for eliminating aggregation of particles. Following milling, the resulting formulation is filtered through a 100 nanometer filter to insure the removal of oversized particles, to provide a monomer-carbon black mix suitable for use in formulating a photopolymer medium in accordance with the invention. Active binder material, sensitizer and photoacid-generators are added to the filtered formulation as described below to form the photopolymer medium.

Figure 3:
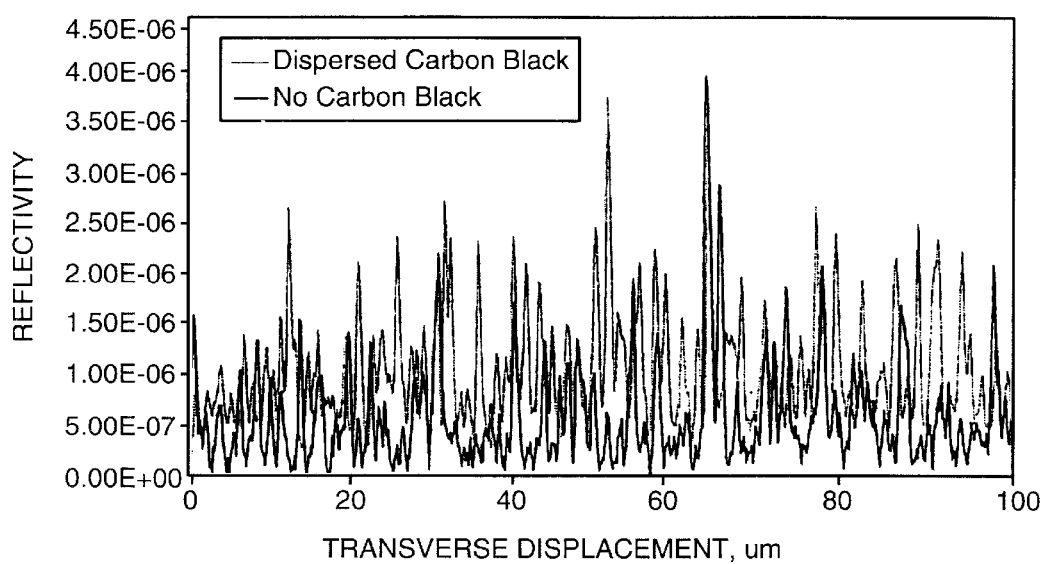
FIG. 3 is a plot of reflectivity versus transverse displacement for media comprising dispersed carbon black and a media comprising no carbon black.

The surface functionalization of carbon black particles in the preceding dispersion example has been confirmed by Fourier Transform Infrared (FT-IR) analysis. The dispersion quality has been confirmed by back scatter of 658 nanometer laser light. FIG. 3 graphs the back scatter of the above formulation after polymerization in a 125 micron thick cell against the back scatter from an equivalent formulation in the absence of carbon black. The polymerization shown has been initiated by thermolysis of an iodonium salt. The disappearance of the silicon-methoxy band at 1084 cm-1 and the appearance of the Si—O—Si band at 1117 $cm^{-1}$ in the FTIR spectra confirm the surface functionalization of the carbon black nanoparticles in the dispersion.

The PC-1000™ monomer used in the above example may be replaced in part by PC-1004™ tetrafunctional monomer, which is also available from Polyset. Thus, carbon black may be added to a monomer mix of PC-1000™ and PC-1004™, in the same manner as described above. The PC-1004™ is dried prior to use in the manner described above for PC-1000™.

The following is a specific example of preparing the photopolymer medium of the invention. The Dow 705™ active binder is purchased through Kurt J. Lesker Company and is dried for 24 hr at 155 degrees C. under vacuum prior to use. Cumyltolyliodonium tetrakis(pentafluorophenyl) borate from Rhodia Inc. is used as received, and 5,12 bis(phenyl-ethynyl)naphthacene from Aldrich Chemical Co. is used as received. Prior to mixing with carbon black, the PC-1000™ and PC-1004™ monomers from Polyset Corp. are dried by passage through activated silica (high purity grade, 70–230 mesh) which has been heated for two days at 155 degrees C. under dry atmosphere, as noted above.

In one embodiment the photopolymer is made using 3–10% (w/w) of cumyltlolyliodonium tetrakis (pentafluorophenyl)borate photoacid generator, 0.002–0.06% (w/w) of 5,12-bis(phenyl-ethynyl) naphthacene sensitizer, 40–75% (w/w) of monomer-carbon black mix prepared as described above, and 20–60% (w/w) of Dow Corning 705™. The monomer mix generally includes both PC-1000™ and PC 1004™, and the weight percent of PC-1000™/PC-1004™ (difunctional monomer/tetrafunctional monomer) within the monomer mix can be varied substantially. Photopolymer having a monomer component of pure PC-1000™ as described in this example has been found to be effective. A preferred PC-1000™/PC-1004™ ratio of the monomer mix is between about 40/60 and 60/40 percent by weight, and most preferably about 50/50 percent by weight. The above ingredients of the photopolymer may be varied within the above weight percent ranges as required for particular uses and properties, such as optical media thickness, substrate composition, laser wavelength, shelf life, grating formation sensitivity, dynamic range, shrinkage, and angular selectivity, as is well known in the art. The above specific photopolymer is merely exemplary, and should not be considered limiting. Various other photopolymers may be used with the invention, and are considered to be within the scope of this disclosure.

The photopolymer is placed between glass slides, plates or sheets separated by a desired thickness to provide a photopolymer layer for optical data storage. The glass plates are mechanically held apart at a 120 micron separation and then retained at that separation and held in place by a UV curable adhesive. The photopolymer is placed between the 120 micron-separated sheets to form a photopolymer layer. The glass sheets may alternatively be held apart by PTFE or polyethylene spacers of desired thickness.

The photopolymer layer described above preferably is thermally pre-cured at a temperature of about 75 degrees Celsius for about 10 hours. This pre-cure provides for an initial degree of polymerization of about 30 percent and helps avoid unwanted shrinkage in subsequent format hologram recording and data writing steps. Other temperature and time period combinations may also be used that allow for an initial polymerization of about 30 percent.

In one embodiment, a format hologram grating is then recorded in the photopolymer layer using a pair of light beams with a wavelength of 532 nanometers incident on opposite sides of the optical storage device. The reflection grating spacing can be tuned for a desired data retrieval wavelength by adjusting the angles of the hologram recording beams. To use data retrieval wavelengths substantially longer than the wavelength of the recording beam, right angle prisms can be used to achieve high angles of incidence at the storage device, as is well known to those skilled in the art. Preferably, the recorded reflection grating spacing is about 1.03 λ/2n, where λ is the desired data retrieval wavelength and n is a refractive index of the medium. When the reflection grating spacing is about 3% larger than λ/2n, efficient resolution is achieved for bit detection using retrieval beams having a numerical aperture of about 0.4 to 0.65. Preferably, the diffraction efficiency of the format grating on the order of 10 to 50 percent, and the exposure energy may be in the range of about 40 $mJ/cm^2$ to 1 $J/cm^2$. Following format hologram recording, the photopolymer may be illuminated with or exposed to white light or other light to which the sensitizer responds (e.g., 532 nm), to exhaust or bleach the sensitizer. Use of light that affects the thermal acid generator (such as UV) is undesirable and should be avoided.

Additional methods for format hologram recording are also described in copending U.S. patent application Ser. No. 09/016,382, "Optical Storage by Selective Localized Alteration of a Format Hologram and/or Retrieval by Selective Alteration of a Holographic Storage Medium" to Hesselink et al., filed Jan. 30, 1998. The configuration of the format hologram may vary as required for particular uses of the invention, to provide different formats for subsequent data writing. A variety of complex format hologram grating structures, including tube, layer and cylindrical shell hologram grating structures, are described in co-pending U.S. patent application Ser. No. 09/229,457, filed on Jan. 12, 1999, to Daiber et al.

In accordance with the invention, a method for recording data via second stage polymerization initiated by nanoparticle heating is provided and comprises the following process. The data recording process begins when a data writing beam of light of a specified intensity is highly focussed into the optical data storage medium at a data storage location and is absorbed by the dispersed nanoparticles. The nanoparticles, upon absorbing the light, effectively and rapidly convert the light to heat, which is transferred to the attached, adsorbed or otherwise associated thermal-acid generators (TAGs). This heat transfer in turn releases a proton from the TAG and, thereby, provides for acid generation. The acid generation provides for the mechanism whereby second stage polymerization occurs, via cationic ring opening polymerization, resulting in the recording of a data bit within the format hologram at the irradiated data storage location. At the focus of the light beam, substantial polymerization draws in and polymerizes the monomer material, and the resulting diffusion segregates out of the focus region at least a portion of the binder material, thereby shifting indices of refraction. In effect, the diffusion of monomer and binder serves to alter or delete holographic fringes that were previously recorded during first stage polymerization. In some embodiments, the alteration may be a microlocalized reduction in amplitude of the format hologram fringes which comprises a deletion or partial deletion. Thus, a data bit in the form of local format hologram deletion is due to a change in the profile of the index of refraction resulting from diffusion caused by the second stage polymerization.

As a specific example of the data writing process in accordance with the invention, a photopolymer comprising carbon black nanoparticles of about 10 nm in diameter is prepared, and format hologram recording is carried out in the manner described above. Data recording is carried out using a laser operating at a wavelength of 658 nm in the range of from about 600 mW to 1 W. The laser is focused to a numerical aperture of about 0.5 and pulsed for about 3 ns. A data bit can be recorded as a local deletion in a format hologram after exposure to about 75 pulses at a pulse repetition rate of about 10–30 Hz.

Generally, the rate of photothermally initiated acid generation during the data writing polymerization is exponential with respect to temperature, so that this rate is nonlinear with respect to light intensity. Therefore, during first stage polymerization, i.e. the hologram recording stage, nanoparticles do not absorb sufficient light to initiate substantial thermal-acid generation. However, thermal curing at substantial temperatures or prolonged heating at lower temperatures may lead to undesired activation of the TAG material and is thus undesirable.

Figure 4:
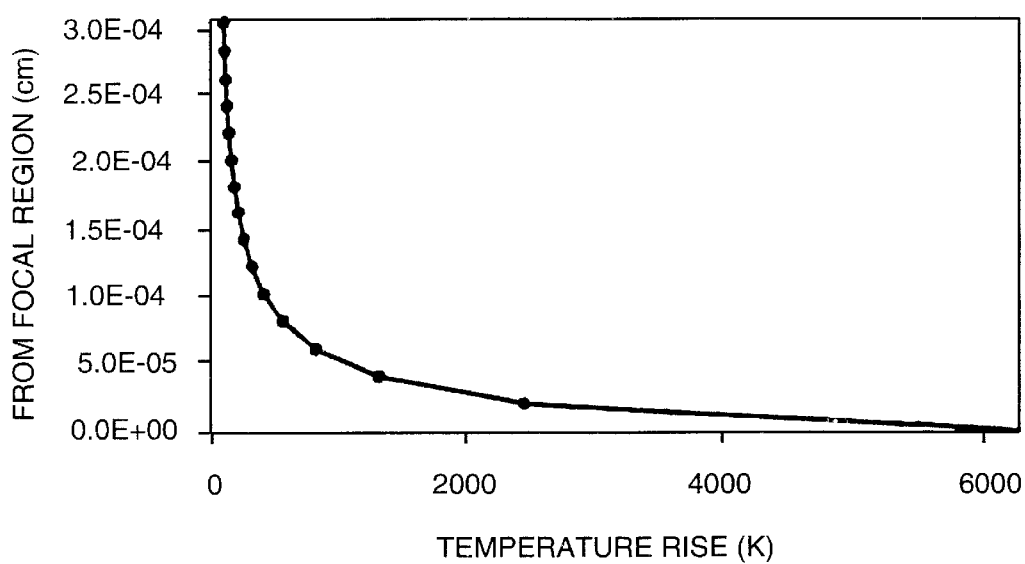
FIG. 4 is plot of temperature rise at the surface of a nanoparticle as a function of the distance removed from the focal point in an optical data storage medium comprising dispersed nanoparticles in accordance with a presently preferred embodiment of the present invention.

Using 10 nanometer diameter nanoparticles exposed to a highly focussed 50 mW, 670 nm laser for 10 ns duration, it is possible to determine the temperature rise induced in the nanoparticles. This estimation takes into account the reasonable assumptions known in the art regarding molar absorptivity and neglecting the complex problem of heat flow from the nanoparticles. FIG. 4 shows the temperature rise as a function of the position away from the focal point in the optical data storage medium. The drop in temperature rise as a function of distance from the focal region indicates the spatial control of this approach to recording data within the medium.

Figure 5:
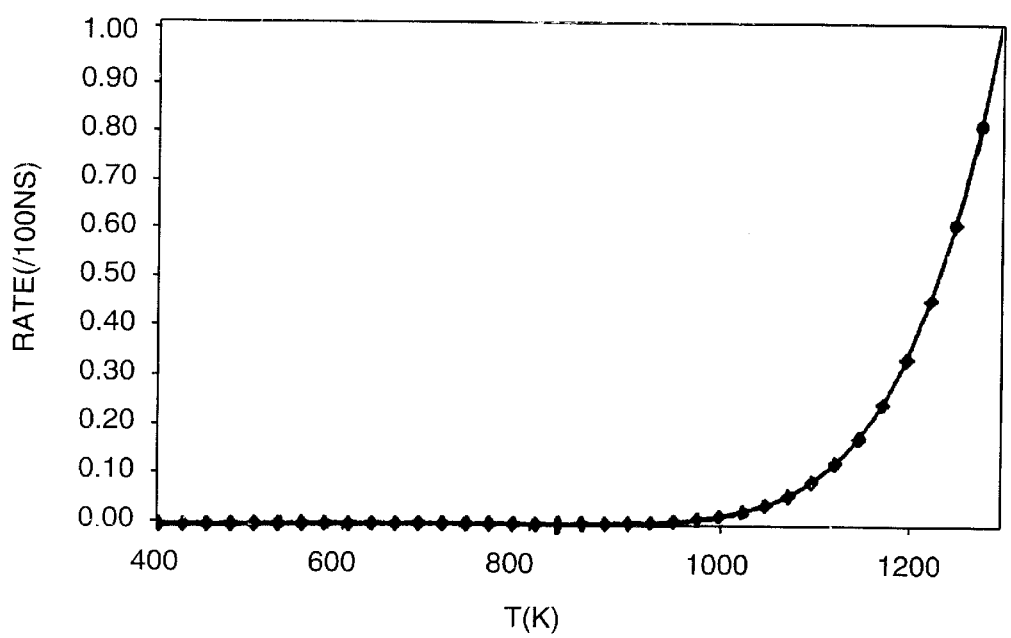
FIG. 5 is a typical plot of the rate of chemical reaction as a function of temperature in an optical data storage medium comprising dispersed nanoparticles in accordance with a preferred embodiment of the present invention.

FIG. 5 shows the plot of the rate of chemical reaction per 100 ns as a function of temperature. The rate of a chemical reaction as a function of temperature can be predicted using the Arrhenius equation: rate=$A * e^{-Ea/RT}$, where A is the Arrhenius A-factor, $E_a$ is the activation barrier, R is the universal gas constant, and T is the temperature. FIG. 5 assumes a reasonable values for Arrhenius A-factor, A=1e13/sec and activation barrier, $E_a$=150 kJ/mole. At 1300 K, the half life of the chemical reaction is 100 ns, but the rate is essentially zero at room temperature. This indicates that in order to write a bit of data in 10–100 ns in a material displaying values similar to those displayed in this instance, it is necessary to obtain a temperature rise of 1000 degrees K in the dispersed nanoparticles.

Low bulk absorption through the entire thickness of the media is required to assure that all depths of the media may be accessed with approximately equal efficiency. This requirement limits the number of particles that may be dispersed in the media. Therefore, the heat generated when the nanoparticle rapidly absorbs photons of light must be sufficient to initiate the requisite chemical reaction.

Alternatively, a method for recording data via second stage, data writing polymerization initiated by the transfer of electrons from a photosensitizer to a photo-acid generator defines another presently preferred embodiment of the present invention. In this embodiment of the invention the photopolymer medium may comprise two distinct sensitizers or one sensitizer. When two sensitizers are present, the first sensitizer is used to sensitize first stage polymerization to record the format hologram, and the second sensitizer is used to sensitize the second stage polymerization to record the data. The first sensitizer, which characteristically responds linearly to photoinitiation, is, typically, consumed during the formatting step and provides for the partial polymerization of the overall medium to form the format hologram. The second sensitizer is used to locally advance polymerization in the data storage locations during the second, data writing stage. Alternatively, one sensitizer may be employed in this embodiment, and used to both write the format hologram in a first stage polymerization and subsequently record the data in a second, data writing polymerization stage. Those of ordinary skill in the art will realize that the sensitizer(s) chosen for a specific use of the invention will be suitable for the corresponding polymer medium. The sensitizer chosen will generally exhibit absorption at the desired wavelength and, upon excitation, the sensitizer will be capable of transferring an electron to the PAG. A presently preferred sensitizer for the invention is 5,12-bis (phenylethynyl)naphthacene or BPEN, as noted above.

A method for recording data via second stage polymerization initiated by the transfer of electrons from a photosensitizer to a photo-acid generator is illustrated as follows. The data recording process begins when a beam of light of a specified intensity is highly focussed into the optical data storage medium. The illuminated storage area preferably has dimensions of about 1 by about 1 micron in the plane of the film (disk) and about 6 microns in depth. This write beam is absorbed by the BPEN photosensitizer. Once the photosensitizer has absorbed a photon, it reaches an excited state that allows for electrons to be transferred from the photosensitizer to the photo-acid generator (PAG). This electron transfer leads to the release of a proton in the PAG and serves to initiate the chemistry for acid generation. The acid generation provides for the mechanism whereby second stage polymerization occurs, resulting in the recording of a data bit within the format hologram in the manner related above. At the focus of the light beam, substantial polymerization draws in the monomer material, and resulting diffusion segregates out of the focus region at least a portion of the binder material, thereby shifting indices of refraction. The diffusion that takes place is three dimensional, occurring predominately in a plane parallel to the disc surface and going through the focus the writing beam and also in the depth dimension. In effect, the diffusion serves to modify or alter holographic fringes that were previously recorded during first stage polymerization. Thus, in a presently preferred embodiment, a data bit in the form of local format hologram deletion is due to a change in the profile of the index of refraction resulting from diffusion.

By way of example, the format hologram grating and the data can be recorded using the following procedures and parameters. In this example the format hologram recording and data writing polymerization steps use the same photosensitizer although, as noted above, different sensitizers may be used for the format hologram recording polymerization and the data writing polymerization. The photopolymer in this example is made using 3–10% (w/w) of cumyltlolyliodonium tetrakis(pentafluorophenyl)borate photoacid generator, 0.002–0.06% (w/w) of 5,12-bis(phenyl-ethynyl) naphthacene sensitizer, 40–75% (w/w) of PC 1000™/PC-1004™ (difunctional/tetrafunctional) monomer mix, and 20–60% (w/w) of Dow Corning 705™. The monomer mix generally includes both PC-1000™ and PC 1004™, and the weight percent of PC-1000™/PC-1004™ (difunctional monomer/tetrafunctional monomer) within the monomer mix can be varied substantially. Photopolymer having a monomer component of pure PC-1000™ as described in this example has been found to be effective. A preferred PC-1000™/PC-1004™ ratio of the monomer mix is between about 40/60 and 60/40 percent by weight, and most preferably about 50/50 percent by weight. The photopolymer thus prepared is placed between glass slides separated by a desired thickness to provide a photopolymer layer for optical data storage in the manner described above. The ingredients of the photopolymer described in this example may be varied within the above weight percent ranges as required for particular uses and properties, such as optical media thickness, substrate composition, laser wavelength, shelf life, grating formation sensitivity, dynamic range, shrinkage, and angular selectivity, as is well known in the art. Once again, the above specific photopolymer is merely exemplary, and should not be considered limiting. Various other photopolymers and photopolymer media may be used with the invention, and are considered to be within the scope of this disclosure.

The photopolymer layer described above is thermally pre-cured at a temperature of about 75 degrees Celsius for about 10 hours. This pre-cure provides for initial degree of polymerization of about 30 percent and helps avoid unwanted shrinkage in subsequent format hologram recording and data writing steps. Other temperature and time period combinations may also be used that allow for an initial polymerization of about 30 percent.

In one embodiment, a format hologram grating may be recorded in the photopolymer layer using a pair of light beams with a wavelength of 532 nanometers incident on opposite sides of the optical storage device. The reflection grating spacing can be tuned for a desired data retrieval wavelength by adjusting the angles of the hologram recording beams. To use data retrieval wavelengths substantially longer than the wavelength of the recording beam, right angle prisms can be used to achieve high angles of incidence at the storage device, as is well known to those skilled in the art. Preferably, the recorded reflection grating spacing is about 1.03 $\lambda/2n$, where $\lambda$ is the desired data retrieval wavelength and n is a refractive index of the medium. When the reflection grating spacing is about 3% larger than $\lambda/2n$, efficient resolution is achieved for bit detection using retrieval beams having a numerical aperture of about 0.4 to 0.65. Preferably, the diffraction efficiency of the format grating on the order of 10 to 50 percent, and the exposure energy may be in the range of about 40 to 100 mJ/cm². In one embodiment, following format hologram recording a substantial amount of sensitizer remains in the photopolymer medium for use in data or bit writing during the second stage polymerization.

Once the format hologram grating is written, data writing is carried out by focussing at the desired storage location a write beam having a wavelength of 658 to 672 nanometers and a power on the order of about 50 milliwatts. In general, the write beam used to store data and the read beam used to read data can be of differing wavelengths. The write beam causes local polymerization, which segregates binder material (high refractive index monomer) out of the bit volume. In a preferred embodiment, spatial segregation of binder causes local alteration or deletion of the format hologram grating. Data may therefore be recorded bit-wise as local variations in the reflectivity of the format grating at selected data storage locations. Thus, in this embodiment the local polymerization decreases the amplitude of the refractive index modulation of the format grating in the desired storage location. As a result, the altered regions reflect substantially less light and data are represented by these decreases in the local reflectivity.

The pulse width (exposure time) required to write a bit of data in the media at a wavelength of 672 nanometers is of the order of 1 microsecond. Writing in an equivalent media at the wavelength of 514 nanometers or choosing a different suitable sensitizer with maximum absorption at the wavelength of 672 nanometers can lower the required pulse width down to a range of about 10 nanoseconds.

The data that is recorded using this example may be read with a beam having a wavelength of 672 nanometers and a power of 5 microWatts. The read beam intensities are substantially lower than write intensities so that the readout beam does not adversely affect the medium over the life of the optical data storage device. The media may be "fixed" by subjecting the media to white, incoherent light (total exposure 100 J/cm²). Once the medium has been fixed it becomes insensitive to further light exposure and the recorded data can be read out repetitively.

In accordance with another preferred embodiment of the present invention, a method is defined as follows for recording data via second stage polymerization initiated by the photo-acid generator's direct two-photon absorption of light. In this embodiment of the invention the polymer medium comprises two distinct types of photoinitiators which may include a photosensitizer or photosensitizer system. The first initiator is used to initiate first stage polymerization to record the format hologram grating and will characteristically respond linearly to photoinitiation. The second initiator is used to initiate the second stage polymerization to record data and will characteristically respond nonlinearly to photoinitiation. In the formatting step the light is absorbed by the first photosensitizer and the first initiator is, generally, consumed, providing for partial polymerization of the photopolymer during format grating formation. In the subsequent data recording step the second initiator is used to locally advance polymerization in the data storage locations. In this embodiment, the data recording step may also be based on direct two-photon absorption by the photo-acid generator (PAG) which leads to excitation of the PAG and initiates second stage polymerization in the photopolymer. Thus, the PAG itself may act as the second, nonlinearly responding sensitizer.

The photopolymer in this example is generally the same as described in the above embodiment, and comprises 3–10% (w/w) of cumyltlolyliodonium tetrakis(pentafluorophenyl)borate photoacid generator or PAG, 0.002–0.06% (w/w) of 5,12-bis(phenyl-ethynyl) naphthacene sensitizer, 40–75% (w/w) of PC 1000™/PC-1004™ (difunctional/tetrafunctional) monomer mix, and 20–60% (w/w) of Dow Corning 705™. The monomer mix generally includes both PC-1000™ and PC 1004™, and the weight percent of PC-1000™/PC-1004™ (difunctional monomer/tetrafunctional monomer) within the monomer mix can be varied substantially. A preferred PC-1000™/PC-1004™ ratio of the monomer mix is between about 40/60 and 60/40 percent by weight, and most preferably about 50/50 percent by weight, although photopolymer having a monomer component of pure PC-1000™ works with this embodiment. The photopolymer is placed between separated glass slides in the manner described above. The ingredients of the photopolymer described in this example may be varied within the above weight percent ranges as required for particular uses and properties, such as optical media thickness, substrate composition, laser wavelength, shelf life, grating formation sensitivity, dynamic range, shrinkage, and angular selectivity, as is well known in the art. Thus, the particular details of this example should not be considered limiting.

The photopolymer layer described above is thermally pre-cured at a temperature of about 75 degrees Celsius for about 10 hours to provide an initial degree of polymerization of about 30 percent and helps avoid unwanted shrinkage in subsequent format hologram recording and data writing steps. Other temperature and time period combinations may also be used that allow for an initial polymerization of about 30 percent.

Format hologram recording is carried out in a manner similar to that related above using a pair of light beams with a wavelength of 532 nanometers incident on opposite sides of the optical storage device. The reflection grating spacing can be tuned for a desired data retrieval wavelength by adjusting the angles of the hologram recording beams. To use data retrieval wavelengths substantially longer than the wavelength of the recording beam, right angle prisms can be used to achieve high angles of incidence at the storage device, as is well known to those skilled in the art. Preferably, the recorded reflection grating spacing is about 1.03 $\lambda/2n$, where $\lambda$ is the desired data retrieval wavelength and n is a refractive index of the medium. When the reflection grating spacing is about 3% larger than $\lambda/2n$, efficient resolution is achieved for bit detection using retrieval beams having a numerical aperture of about 0.4 to 0.65. Preferably, the diffraction efficiency of the format grating on the order of 10 to 50 percent, and the exposure energy may be in the range of about 40 mJ/cm$^2$ to 1 J/cm$^2$. Following format hologram recording, the photopolymer may be illuminated with or exposed to white light or other light to which the sensitizer responds (e.g., 532 nm), to exhaust or bleach the sensitizer. Use of light that affects the thermal acid generator (such as UV) is undesirable and is preferably avoided.

In a preferred embodiment, once the format hologram grating is written, data is recorded by focussing at the desired storage location a write beam having a wavelength of 659 nanometers and a power of 50 milliwatts. In general, the write beam used to store data and the read beam used to read data can be of differing wavelengths. The write beam causes local polymerization, which segregates binder material (high refractive index monomer) out of the volume of the bit volume. This spatial segregation of binder causes local erasure of the format hologram grating. Data may therefore be recorded bit-wise as local variations in the reflectivity of the format grating. The local polymerization decreases the amplitude of the refractive index modulation of the format grating in the desired storage location. As a result, the altered regions reflect substantially less light and data are represented by these decreases in the local reflectivity.

The pulse width (exposure time) required to write a bit of data using two-photon absorption by the PAG at a wavelength of 659 nanometers is of the order of 3 seconds. The longer exposure time and higher intensity beam are necessary to move the PAG into the required excited state and induce the requisite two-photon absorption. The exposure time can be significantly reduced by using more efficient two-photon dyes with higher absorption cross-sections.

The data that is recorded using this example may be read with a beam having a wavelength of 659 nanometers and a power of 50 microWatts. The read beam intensities are substantially lower than write intensities so that the readout beam does not adversely affect the medium over the life of the optical data storage device.

Figure 6:
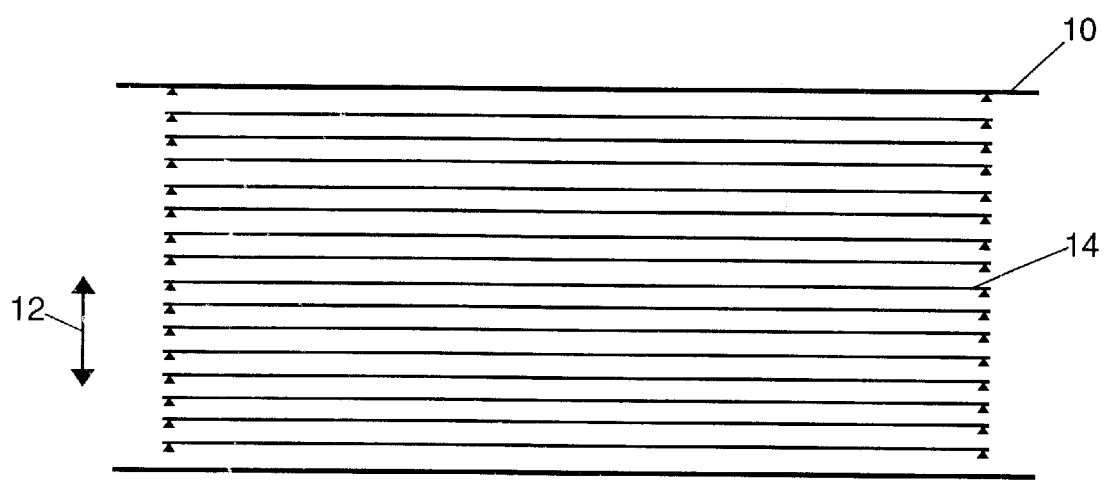
FIG. 6 is a schematic drawing of an elevational cross section of an optical data storage medium in accordance with a presently preferred embodiment of the present invention.

Referring to FIG. 6, there is shown a cross-sectional elevational schematic drawing of the optical data storage medium 10 used in a presently preferred embodiment of the invention. This optical data storage medium will be comprised, in part, of the nanoparticles (not shown) or other data writing polymerization initiator as discussed previously. The optical data storage medium 10 shown in FIG. 6 has a format grating having a periodic, spatially-modulated refractive index that varies along a single depth axis 12 of the medium, defining a plurality of reflective Bragg fringes 14. Preferably, the optical data storage medium 10 is typically on the order of magnitude of 100 microns in thickness, for instance, about 100–200 $\mu$m, and in particular about 125 $\mu$m and the spacing between Bragg fringes 14 is approximately one thousand times smaller, on the typical order of magnitude of 100 nanometers, for instance about 170 nanometers. The spacings shown in FIG. 6, therefore, are not drawn to scale. The format hologram shown in FIG. 6 is merely illustrative, and may have other configurations.

Figure 7:
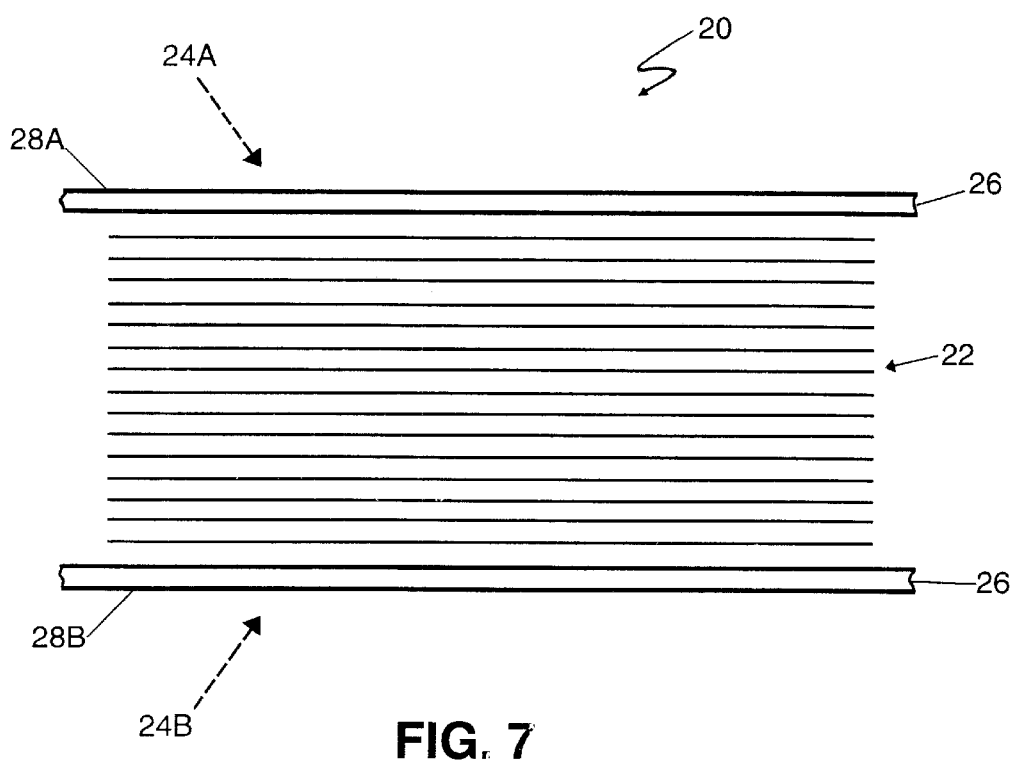
FIG. 7 is a schematic diagram of an elevational cross section of an optical data storage device and two plane-wave beams used to form interference fringes within the medium in accordance with a presently preferred embodiment of the present invention.

A presently preferred method for creating an optical data storage device 20 is to use the holographic recording technique illustrated in FIG. 7. In this illustration the device that is being formed is an optical data storage disk, it is also conceivable and within the inventive scope to form the device as a tape, card or other suitable optical data storage devices as are known by those of ordinary skill in the art. Here the optical data storage device 20 is formed by exposing a planar, initially homogeneous photosensitive layer 22 of material to two coherent monochromatic light beams 24a–b. Beams 24a–b can be generated from a single beam of laser light using a beam splitter and optical elements (not shown in FIG. 7) well-known to those of ordinary skill in the art of holography. The photosensitive layer 22 can be formed, for example, by depositing a small amount of optical data storage medium between two glass plates 26. The optical data storage medium will comprise a photopolymer medium of the types described above. The beams 24a–b are incident upon opposite sides 28a–b of the material at slightly oblique angles. An interference pattern of light and dark fringes is established that alters the refractive index, via first stage polymerization, of the bulk material in those parts of the layer where the beams 24a–b constructively interfere. The spacing between these fringes will be on the order of half the wavelength of beams 24a–b. The exposed hologram thus recorded may be fixed to render the photopolymer insensitive to further exposure at the particular wavelength used to record the format hologram (but not to the wavelength used for subsequent data writing). Once the hologram is fixed, the photopolymer is referred to as being polymerized or resulting in a photopolymer product.

It should be emphasized that the optical storage medium of the present invention does not, typically, store data holographically in the conventional manner by simply recording a hologram containing digital data. In particular, the format hologram does not itself represent recorded data. Instead, data is stored bit-by-bit at discrete physical locations within the recording medium by altering the format hologram during writing. In this sense, the data storage of the present invention more closely resembles bit-based optical storage than conventional page-based holographic volume storage. Strictly speaking, in a presently preferred embodiment of the present invention, holography is used to format the bulk recording material only, and writing data to the medium is performed using essentially non-holographic techniques. The present invention can be employed on a recording medium that has a spatially-modulated refractive index that can be altered locally with a write pulse. Therefore it is conceivable and within the scope of the invention to implement any other material with these properties, regardless of whether or not the material was produced by holographic means. Other, non-holographic methods for creating a bulk recording medium with a periodic, spatially-modulated refractive index could also be used. In addition, other holographic techniques may be used to write the format hologram. For example, the format hologram may be an elementary phase reflection hologram (i.e. a hologram written with two plane waves) although other types of format hologram structures are suitable as well.

Figure 8A:
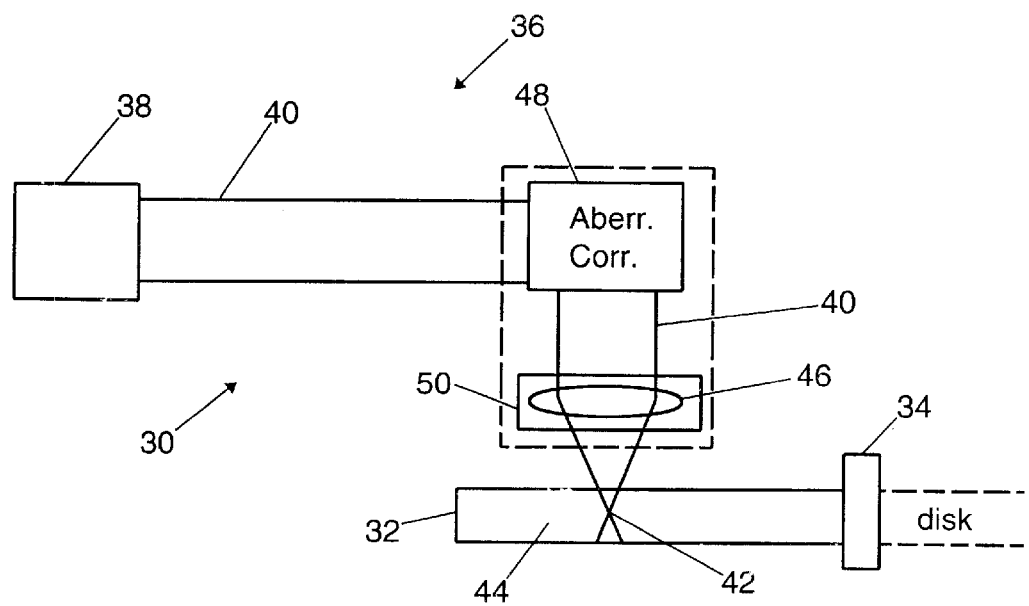
FIG. 8A is a schematic drawing of an optical data recording system in accordance with a preferred embodiment of the present invention.

In another preferred embodiment of the present invention, a schematic drawing of an optical data storage system 30 is shown in FIG. 8A. The optical storage device 32 is disk-shaped and mounted on a rotary platform 34. The platform 34 continuously rotates the storage device 32 under a recording head 36 at a high angular velocity about an axis parallel with the depth axis. Light source 38 generates a write beam 40, which can be focused at desired storage locations 42 within the optical data storage medium 44 using tunable optics housed within the recording head 36. The storage medium 44, in accordance with the presently preferred embodiment of the present invention, will be formed from a photopolymer medium having nanoparticles or other second stage polymerization initiator dispersed or dissolved throughout the medium. The optics of the recording head 36 include a high numerical aperture objective lens 46 and a dynamic aberration compensator 48. Objective lens 46 generally has a numerical aperture in the range of, e.g., 0.4 to 0.65 or higher. Higher numerical apertures translate into shorter depths of field and smaller spot sizes at the beam focus, which, in turn, translate into greater recording density. The lens 46 is mounted on a multiple-axis actuator 50, such as a voice-coil motor, which controls the focusing and fine-tracking of the lens 46 relative to the medium 44.

When focused at a depth within the bulk recording medium 44, the write beam 40 will generally experience spherical aberration as it focusses to a location inside a medium of an index of refraction substantially different than the ambient index, such as air. The degree of these aberration effects will depend on the numerical aperture of the beam and depth accessed by the beam. Spherical aberration causes undesirable blurring of the beam at its focus, but it can be corrected using an aberration compensator 48. Any appropriate aberration compensator may be used and a description of the aberration compensator is omitted from this disclosure in order to avoid overcomplicating the disclosure. For a more detailed discussion of an appropriate aberration compensator see, for example, copending U.S. patent application Ser. No. 09/016,382 filed on Jan. 30, 1998, in the name of inventor Hesselink et al., entitled "Optical Data Storage by Selective Localized Alteration of a Format Hologram and/or retrieval by Selective Alteration of a Holographic Storage Medium." See also U.S. Pat. No. 5,202,875, issued Apr. 13, 1993 to Rosen et. al., entitled "Multiple Date Surface Optical Data Storage System" and U.S. Pat. No. 5,157,555, issued Oct. 20, 1992, to Reno, entitled "Apparatus for Adjustable Correction of Spherical Aberration," which are hereby expressly incorporated by reference as if set forth fully herein.

Figure 9:
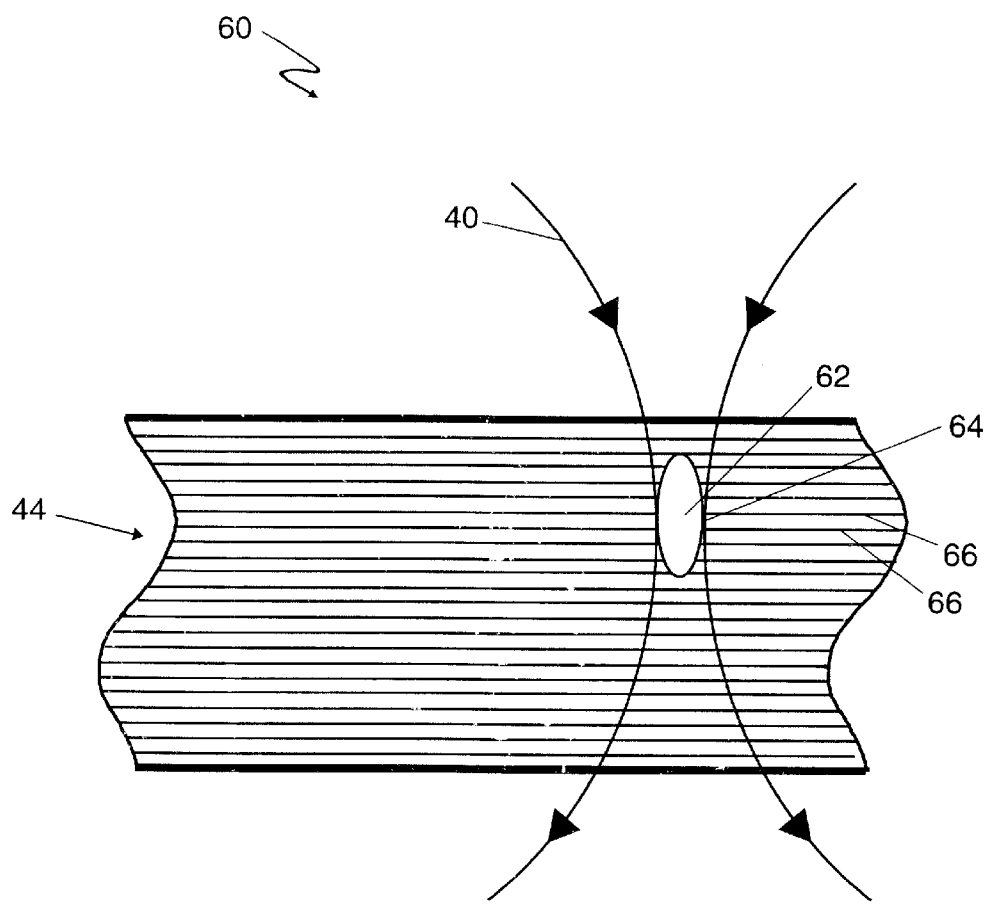
FIG. 9 is a schematic drawing of a method for writing data onto a storage location within a optical data storage medium, according to a presently preferred embodiment of the present invention.

The data writing procedure of the invention is illustrated schematically in the optical data storage device of FIG. 9. In order to record a bit of data, the write beam 40 is focused at a desired storage location 62 within the medium 44. The medium, in accordance with the presently preferred embodiment of the present invention, will be formed from a photopolymer medium and a photo-thermal-initiated polymer medium having nanoparticles dispersed throughout a matrix. In general, there is no requirement that the write beam 40 have the same frequency as a retrieval beam used later to read the data. As will be apparent to those of ordinary skill in the art, the storage locations can be arranged in a variety of ways throughout the volume of recording medium 44. They may be arranged, for example, in a 3-dimensional lattice, rectangular or otherwise, so that data can be stored on multiple layers at various depths within the medium 44.

Figure 8B:
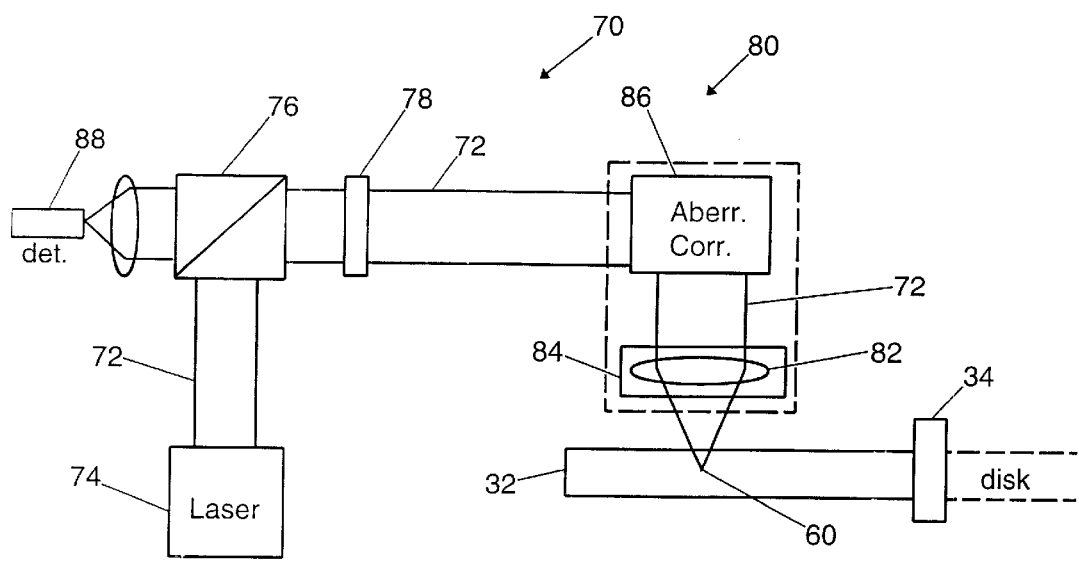
FIG. 8B is a schematic drawing of an optical data retrieval system in accordance with a preferred embodiment of the present invention.

Because the condition for Bragg reflection from the local alterations 68 is distinct from that of the bulk recording medium 44, the alterations 64 can be detected as variations in the reflectivity of the storage locations 62 using an optical data retrieval system such as the one shown schematically in FIG. 8B.

In accordance with the data retrieval system 70 of FIG. 8B, a retrieval beam is produced by a light source 74 and passed through a polarizing beam splitter 76 and a quarter wave plate 78. Polarizing beam splitter 76 and quarter wave plate 78 are preferably used instead of simple beam-splitters for reducing losses at the separation elements and to suppress feedback to the laser. As with the write beam 40 (FIG. 8A), the retrieval beam 72 is focused with a retrieval head 80 including a high numerical aperture lens 82 mounted on a multiple-axis servo motor 84 and an aberration compensator 86.

Light reflected from the bulk recording medium 10 is measured with detector 88. Detector 88 is preferably a confocal, depth-selective detector that includes spatial filtering optics that permit it to detect light which is Bragg-reflected from only those storage locations 60 at desired depths within the medium 10. Spatial filtering optics are well known to those of ordinary skill in the art.

Figure 8C:
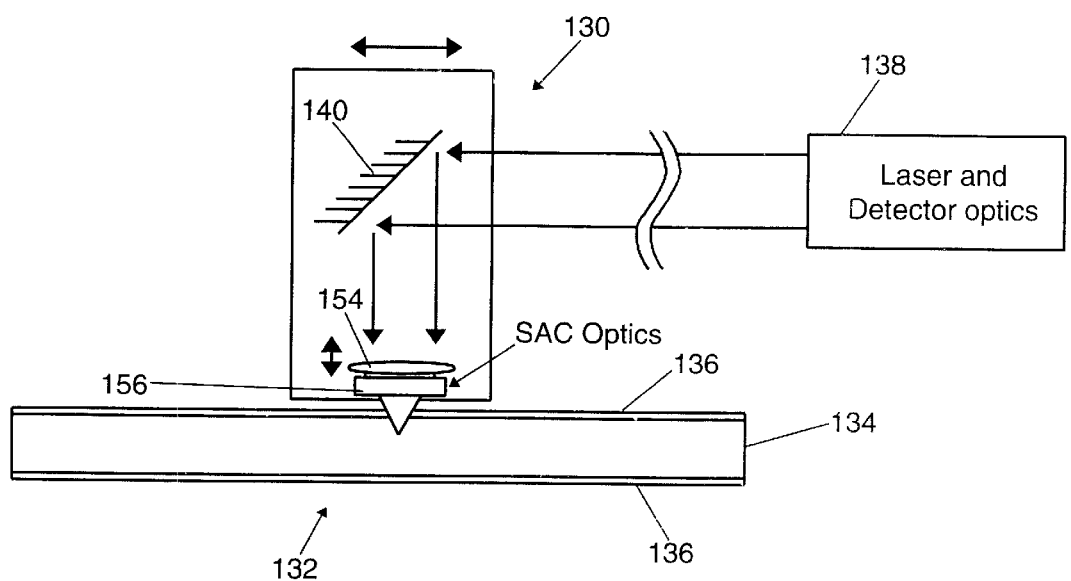
FIG. 8C is a schematic drawing of an optical data recording and/or retrieval system in accordance with another preferred embodiment of the present invention.

Referring to FIG. 8C, there is shown an embodiment of the present invention in which an optical head 130 is positioned to access a storage device 132 comprising a photopolymer 134, which further comprises a format hologram. The photopolymer medium 134 may be generally disposed between two cover layers 136 (e.g. glass) for stability and protection from the environment. Optical head 130 is used for both reading from and writing to the medium 134. The output of optical head 130 is optically coupled to laser and detector optics 138 using reflecting surface 140. An objective lens 154 in optical head 130 focuses the access beam onto the medium. A dynamic spherical aberration corrector (SAC) 156 is optionally present in the path of the beam to correct for variations in spherical aberration that arise as different depths are accessed in the medium 134. Depending on the type of spherical aberration corrector used, it may be located before or after the objective lens 154.

Figure 8D:
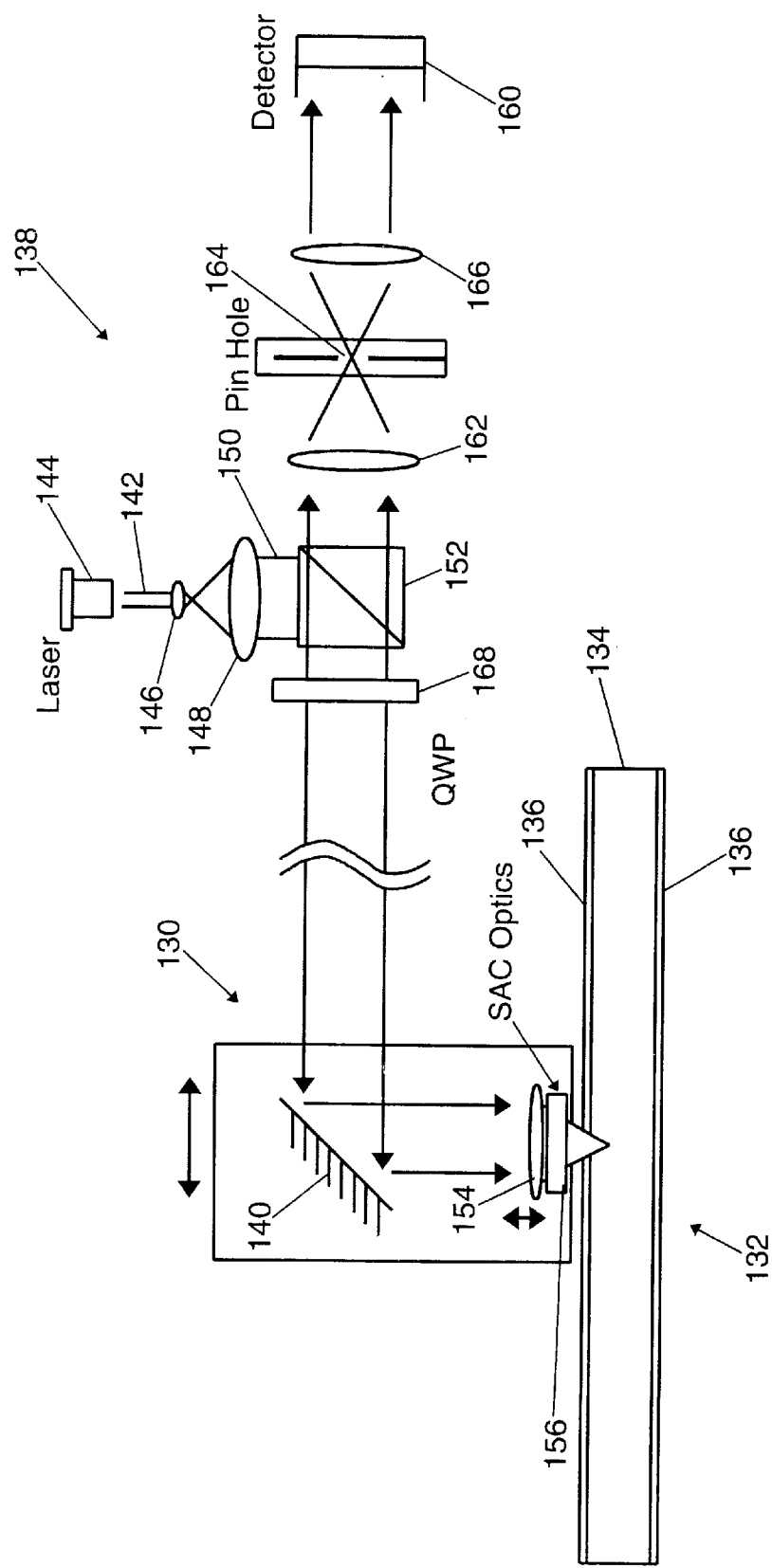
FIG. 8D is a schematic drawing of an optical recording and/or retrieval system in accordance with yet another preferred embodiment of the present invention.

Referring next to FIG. 8D, there is shown another embodiment of the present invention, with like reference numbers denoting like parts, in which laser and detector optics 138 include a confocal detector to discriminate light reflected from a desired layer. Laser illumination 142 from laser 144 for the access beam is expanded and directed toward the medium 134 by lenses 146 and 148. The expanded beam 150 passes through a beam splitter 152, which is present to couple the incident beam into the access path. The output of optical head 130 is optically coupled to laser 144 and detector optics 138 using reflecting surface 140. The objective lens 154 in optical head 330 focuses the access beam onto the medium. A dynamic spherical aberration corrector (SAC) 156 is optionally present in the path of the beam to correct for variations in spherical aberration that arise as different depths are accessed in the medium 134. Depending on the type of spherical aberration corrector used, it may be located before or after the objective lens 154. Light is focussed with a numerical aperture in the range of, e.g., 0.4 to 0.65 or higher. Thus, for visible wavelengths, spot sizes used to access data are on the order of about 1 mm or smaller.

Light is reflected from the accessed point in the medium 134. Reflected light is returned through spherical aberration corrector 156 and the objective lens 154. Reflected light passes through the beam splitter 152 towards the detector 160. A first lens 162 focuses the light to a point of focus. A pinhole 164 is situated to admit the focused light corresponding to the accessed layer; a pinhole situated in this manner is a well-known basis for confocal detection. A second lens 166 collimates the light, which is then detected by detector 160. An optional quarter wave plate 168 inserted between a polarizing beam splitter and the material will cause substantially all of the returning light to be deflected to the detector 160. In the case of a rotatable media such as a disk, rotation brings different regions of the medium into the range accessible to the optical head. The head is adjusted to position the focussed beam radially to access different tracks in the radial direction and in depth to access different data layers, by use of well known positioning techniques.

Figure 10:
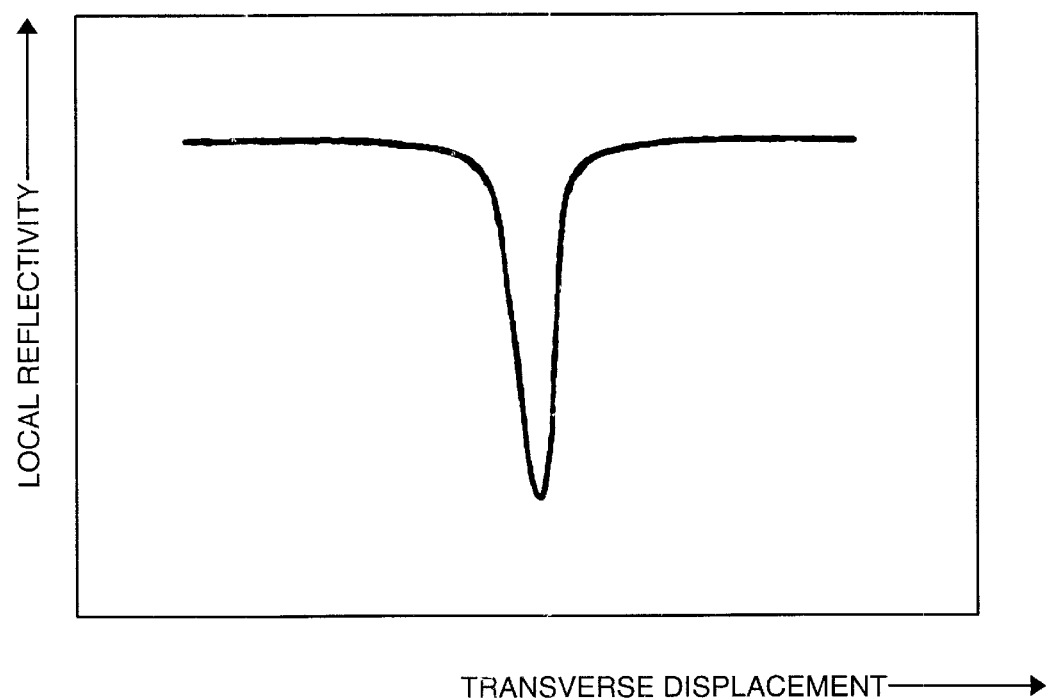
FIG. 10 is a plot showing reflectivity profile of a negative bit along a circumferential direction at a constant depth, in accordance with a preferred embodiment of the present invention.

Readout of the recorded information is preferably carried out as follows. Retrieval beam 72 is tuned to the Bragg reflection condition of the bulk recording medium 10, such that alterations 62 will reflect more light relative to the unaltered bulk medium 10. If bulk recording medium 10 is spinning beneath the retrieval head 80, then the alterations 62 will appear to the detector 88 as a negative bit or a momentary drop in reflected intensity, as is shown in FIG. 10.

ALTERNATIVE EMBODIMENTS

Although illustrative presently preferred embodiments and applications of this invention are shown and described herein, many variations and modifications are possible which remain within the concept, scope and spirit of the invention, and these variations would become clear to those skilled in the art after perusal of this application. The invention, therefore, is not limited except in spirit of the appended claims.

What is claimed is:

1. An optical data storage device comprising:

a photopolymer medium, said photopolymer medium having a format hologram recorded therein; and, said photopolymer including a data writing polymerization initiator for permitting data writing over said format hologram, wherein data writing polymerization initiator comprises light absorbing nanoparticles, said nanoparticles initiating thermal chemistry upon absorption of light.

2. The optical data storage device of claim 1, wherein said nanoparticles further comprise a thermal-acid generator, associated with said nanoparticles, which produces an acid upon exposure to heat transferred from said nanoparticles.

3. The optical data storage device of claim 1, wherein said nanoparticles further comprise carbon black particles.

4. The optical data storage device of claim 1 wherein said nanoparticles are generally less than about 20 nanometers in diameter.

5. The optical data storage device of claim 1 wherein said nanoparticles have a linear absorption coefficient on the order of $1 \times 10^5$/cm.

6. The optical data storage device of claim 1 wherein said nanoparticles have a non-emissive excited state of less than about 1 nanosecond.

7. An optical data storage system comprising:

a photopolymer medium, said photopolymer medium having a format hologram stored therein;

a data writing beam;

optics means for focusing said data writing beam at a plurality of selectable data storage locations in said photopolymer medium; and said photopolymer medium including a photo-activated data writing polymerization initiator for permitting data writing over said format hologram, said data writing initiator sensitive to said data writing beam, wherein data writing polymerization initiator comprises light absorbing nanoparticles, said nanoparticles initiating thermal chemistry upon absorption of light.

8. The optical data storage system of claim 7, wherein said nanoparticles further comprise a thermal-acid generator, attached to said nanoparticles, which produces an acid upon exposure to heat transferred from said nanoparticles.

9. The optical data storage system of claim 7, wherein said nanoparticles further comprise carbon black particles.

10. The optical data storage system of claim 7 wherein said nanoparticles are generally less than about 20 nanometers in diameter.

11. The optical data storage system of claim 7 wherein said nanoparticles have a linear absorption coefficient on the order of $1 \times 10^5$/cm.

12. The optical data storage system of claim 7 wherein said nanoparticles have a non-emissive excited state of less than about 1 nanosecond.

* * * * *

UNITED STATES PATENT AND TRADEMARK OFFICE
CERTIFICATE OF CORRECTION

PATENT NO. : 6,512,606 B1
DATED : January 28, 2003
INVENTOR(S) : Lipson et al.

It is certified that error appears in the above-identified patent and that said Letters Patent is hereby corrected as shown below:

<u>Title page,</u>
Item [75], Inventors, delete "MeCleod" and replace thereof with -- McLeod -- after "Robert R." and before ", Morgan Hill;"

Signed and Sealed this

Twentieth Day of April, 2004

JON W. DUDAS
*Acting Director of the United States Patent and Trademark Office*